ial, Jun., 1998, p. 70.*

United States Patent
Dordi et al.

(10) Patent No.: US 6,423,636 B1
(45) Date of Patent: Jul. 23, 2002

(54) PROCESS SEQUENCE FOR IMPROVED SEED LAYER PRODUCTIVITY AND ACHIEVING 3MM EDGE EXCLUSION FOR A COPPER METALIZATION PROCESS ON SEMICONDUCTOR WAFER

(75) Inventors: Yezdi Dordi, Palo Alto; Michael Sugarman, San Francisco, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/443,832

(22) Filed: Nov. 19, 1999

(51) Int. Cl.$^7$ ............................................... H01L 21/44

(52) U.S. Cl. ...................... 438/678; 438/679; 438/687

(58) Field of Search ................................ 438/678, 687, 438/679

(56) References Cited

U.S. PATENT DOCUMENTS

| | | | | |
|---|---|---|---|---|
| 3,835,017 A | * | 9/1974 | Mentone et al. | 204/224 R |
| 4,428,815 A | | 1/1984 | Powell et al. | 204/297 W |
| 4,435,266 A | | 3/1984 | Johnston | 204/276 |
| 4,605,483 A | * | 8/1986 | Michaelson | 204/280 |
| 5,222,310 A | * | 6/1993 | Thompson et al. | 34/202 |
| 5,224,504 A | * | 7/1993 | Thompson et al. | 134/155 |
| 5,230,743 A | * | 7/1993 | Thompson et al. | 134/32 |
| 5,256,274 A | * | 10/1993 | Poris | 205/123 |
| 5,259,407 A | * | 11/1993 | Tuchida et al. | 134/151 |
| 5,316,974 A | * | 5/1994 | Crank | 437/190 |
| 5,377,708 A | * | 1/1995 | Berman et al. | 134/105 |
| 5,429,733 A | * | 7/1995 | Ishida | 204/224 R |
| 5,486,282 A | * | 1/1996 | Datta et al. | 205/123 |
| 6,056,869 A | * | 5/2000 | Uzoh | 205/771 |

FOREIGN PATENT DOCUMENTS

| | | | | |
|---|---|---|---|---|
| JP | 58182823 | 10/1983 | | H01L/21/288 |
| JP | 63118093 | 5/1988 | | C25D/5/18 |
| JP | 04131395 | 5/1992 | | C25D/5/34 |
| JP | 04280993 | 10/1992 | | C25D/5/18 |
| JP | 6017291 | 1/1994 | | C25D/7/12 |
| WO | WO 97/12079 | 4/1997 | | C25D/5/02 |
| WO | WO 99/25905 | * | 5/1999 | C25D/5/02 |

OTHER PUBLICATIONS

PCT International Search Report dated Feb. 7, 2000.

Peter Singer, "Tantalum, Copper and Damascene: The Future of Interconnects," Semiconductor International, Jun., 1998, pages cover, 91–92, 94, 96 & 98.*

Peter Singer, "Wafer Processing," Semiconductor International, Jun., 1998, p. 70.*

(List continued on next page.)

*Primary Examiner*—John F. Niebling
*Assistant Examiner*—Lynne A. Gurley
(74) *Attorney, Agent, or Firm*—Moser, Patterson & Sheridan, LLP

(57) ABSTRACT

The present invention generally provides an apparatus and a method for electrochemical deposition of a metal layer on a substrate that achieves high throughput and minimal edge exclusion. The invention provides a method for forming a metal layer on a substrate comprising: depositing a full coverage seed layer over the substrate; electrochemically depositing a metal layer over the seed layer; and removing any exposed seed layer from an annular edge portion of the substrate. The invention also provides an apparatus for forming a metal layer on a substrate comprising: an electrochemical deposition cell having a cathode contact member adapted to contact a peripheral portion of a substrate at less than about 3 mm from an edge of the substrate, a processing cell adapted to remove any exposed seed layer on a peripheral portion of the substrate; and a transfer chamber having a robot adapted to transfer a substrate between the electrochemical deposition cell and the processing cell for removing exposed seed layer.

16 Claims, 7 Drawing Sheets

OTHER PUBLICATIONS

U.S. Patent Application No. 09/289,074, Dordi et al., "Electro–Chemical Deposition System", filed Apr. 8, 1999.*

U.S. Patent Application No. 09/201,796, Joe Stevens, Cathode Contact Ring for Electrochemical Deposition:, filed Nov. 30, 1998.*

U.S. Patent Application No. 09/201,486, Lakshmikanthan et al., "An Inflatable Compliant Bladder Assembly", filed Nov. 30, 1998.*

U.S. Patent Application No. 09/245,780, Dordi et al., "Electrodeposition Chemistry for Improved Filling of Apertures", filed Feb. 5, 1999.*

* cited by examiner

PROCESS SEQUENCE FOR IMPROVED SEED LAYER PRODUCTIVITY AND ACHIEVING 3MM EDGE EXCLUSION FOR A COPPER METALIZATION PROCESS ON SEMICONDUCTOR WAFER

BACKGROUND OF THE INVENTION

1. Field of the Invention

The present invention relates to an apparatus and a method for forming a metal layer on a substrate. More particularly, the present invention relates to an apparatus and a method for forming a metal layer on a substrate utilizing a full coverage seed layer and electrochemical deposition.

2. Background of the Related Art

Copper has become a choice metal for filling sub-micron high aspect ratio interconnect features on substrates as circuit densities increase for the next generation of ultra large scale integration (ULSI) because copper and its alloys have lower resistivity than aluminum and significantly higher electromigration resistance as compared to aluminum. These characteristics are important for supporting the higher current densities experienced at high levels of integration and increased device speeds.

Despite the desirability of using copper for semiconductor device fabrication, choices of fabrication methods for depositing copper into very high aspect ratio features are limited because common chemical vapor deposition processes and physical vapor deposition processes have provided unsatisfactory results for commercial production requirements, such as high throughput, low defects, and consistent uniformity. Furthermore, these processes can be costly. As a result, electroplating or electrochemical deposition is becoming an accepted method for copper metallization of interconnect features in semiconductor devices.

Generally, a copper metallization scheme for forming interconnect features on s substrates comprises physical vapor depositing a barrier layer over the feature surfaces, physical vapor depositing a conductive metal seed layer, preferably copper, over the barrier layer, and then electroplating a conductive metal, preferably copper, over the seed layer to fill the interconnect feature. The deposited layers and the dielectric layers are then planarized, such as by chemical mechanical polishing (CMP) or etching, to define a conductive interconnect feature.

Metal electroplating in general is a well known-art and can be achieved by a variety of techniques. Present cell designs for electroplating a metal onto a substrate are generally based on a fountain plater configuration. FIG. 1 is a cross sectional view of a typical fountain plater 100. In a fountain plater configuration, the substrate 10 is secured onto a substrate holder 26 positioned above a cylindrical electrolyte container 102 with the plating surface facing an opening of the cylindrical electrolyte container. The electrolyte (i.e., plating solution) is pumped into the cell through an electrolyte inlet 30 and flows upwardly to contact the substrate plating surface. An electrical power supply 31 is connected to a cathode contact member 22 and an anode 32 of the system. The cathode contact member 22 of the plating system delivers an electrical current (i.e., a forward plating current) through a seed layer formed on the substrate 10 which induces the metal ions in the electrolyte to deposit onto the exposed conductive surface of the substrate. The anode 32 is typically disposed in the electrolyte and is electrically biased to attract the negatively charged counterparts of the metal ions in the electrolyte.

However, a number of obstacles impair commercially acceptable copper metallization of interconnect features on semiconductor devices that satisfies commercial standards such as high throughput and low edge exclusion. One problem encountered by currently practiced copper metallization using electrochemical deposition is that the edge exclusion of the deposition process is much larger than commercially acceptable standards of about 3 mm or less. Typically, the edge exclusion, i.e., the peripheral portion of the substrate that is wasted because of the constraints of the processing system, is greater than about 6 mm, and the number of devices that can be formed on the substrate is decreased because of the large edge exclusion. In currently practiced copper metallization schemes using electrochemical deposition, the seed layer is deposited in a PVD chamber having a shadow or cover ring that shields a peripheral portion of the substrate from deposition because deposition on the edge and backside portions of the substrate may peel or flake off of the substrate and form contaminate particles during subsequent processes, such as a chemical mechanical polishing (CMP) process, potentially causing defect formations in the devices. Because there is no current commercially acceptable method for removing unwanted deposition from the bevel edge and the backside of a substrate, a shadow ring has to be utilized to prevent deposition on the edge and backside surfaces of the substrate.

FIG. 2A is a cross sectional view of an edge portion of a substrate 10 and a shadow ring 20 disposed above the substrate in a typical PVD system utilized for depositing a seed layer. Typically, the shadow ring 20 prevents deposition onto an annular peripheral portion 12 of the substrate about 3 mm from the edge of the substrate. The shadow ring 20 also prevents unwanted deposition onto the edge 14 and the backside surface 16 of the substrate. As shown in FIG. 2A, the peripheral portion indicated by the distance $d_1$ is blocked by the shadow ring from receiving seed layer deposition. The resulting deposited seed layer 18 has an edge exclusion, as indicated by the distance $d_1$, typically about 3 mm from the edge of the substrate.

FIG. 2B is a cross sectional view of an edge portion of a substrate 10 disposed on a substrate holder 26 and a cathode contact member 22 of an electroplating system. Because the seed layer 18 has an edge exclusion of about 3 mm, the cathode contact member 22 of the electroplating system must be positioned radially inward of the edge of the seed layer to provide good electrical contact thereto. As a result, the cathode contact member 22 typically contacts the substrate between about 3–6 mm from the edge of the substrate, thereby preventing electrochemical deposition of metal layer 24 on the peripheral portion of the substrate between the edge of the substrate and about 6 mm radially inward from the edge of the substrate, as indicated by the distance $d_2$. This large edge exclusion significantly decreases the number of devices that may be formed on a substrate, thereby increasing the cost per device formed on the substrate.

Furthermore, the shadow ring complicates the hardware design of the PVD chamber for depositing the seed layer by requiring delivery of the substrate onto the substrate support member in the chamber with high precision of concentricity with respect to the shadow ring. The substrate seed layer must be deposited substantially concentric with the substrate deposition surface to facilitate proper contact between the contact ring of the electroplating system and the seed layer during the electroplating process. The use of a shadow ring also shortens the life of the process kit in the chamber because the shadow ring must be removed when the deposition build-up on the shadow or shadow ring exceed an acceptable limit. Furthermore, build-up of the seed layer material on the shadow ring may flake off and cause contamination and defect formation on the substrate. These problems presented by the shadow ring increase production cost, decrease uptime and decrease productivity.

Therefore, there is a need for an apparatus and a method for electrochemical deposition of a metal layer on a substrate that achieves less than 3 mm edge exclusion. It would be desirable to eliminate the need for a shadow ring for the formation of the seed layer. It would be further desirable to increase productivity and reduce the cost of each device.

SUMMARY OF THE INVENTION

The present invention generally provides an apparatus and a method for electrochemical deposition of a metal layer on a substrate that achieves high throughput and minimal edge exclusion. One aspect of the invention provides a method for forming a metal layer on a substrate comprising: depositing a full coverage seed layer over the substrate; electrochemically depositing a metal layer over the seed layer; and removing any exposed seed layer from an annular edge portion of the substrate.

In one aspect, the step of electrochemically depositing a metal layer over the seed layer comprises: electrically contacting a cathode contact member with the seed layer at a peripheral portion of the substrate that is less than about 3 mm from an edge of the substrate; and positioning the substrate in an electroplating solution in an electroplating cell. The step of removing the exposed seed layer comprises: positioning the substrate in a de-plating cell; positioning a de-plating cathode contact member adjacent the substrate; and applying a forward plating bias to the cathode contact member.

Another aspect of the invention provides a wet etch cell and method for removing exposed seed layer from a peripheral portion of the substrate. The method of removing the exposed seed layer comprises positioning the substrate in a wet etch cell and contacting the exposed seed layer with an etching solution.

Another aspect of the invention provides a method for electrochemically depositing a metal layer over a full coverage seed layer and removing any exposed seed layer after the metal layer has been electrochemically deposited. The step of electrochemically depositing a metal layer comprises electrically contacting a cathode contact member with the full coverage seed layer at a peripheral portion of the substrate that is less than about 3 mm from an edge of the substrate; positioning the substrate in an electroplating solution in an electroplating cell; securing the substrate on a substrate holder having an inflatable bladder disposed at a peripheral portion of a back surface of the substrate; and inflating the bladder against the peripheral portion of the back surface of the substrate. The step of removing the exposed seed layer comprises deflating the inflatable bladder; positioning the cathode contact member between about 0 mm and about 2 mm from the substrate; and applying a forward plating bias to the cathode contact member.

Another aspect of the invention provides an apparatus for forming a metal layer on substrate comprising an electrochemical deposition cell having a cathode contact member adapted to contact a peripheral portion of a substrate at less than about 3 mm from an edge of the substrate; a processing cell adapted to remove exposed seed layer on a peripheral portion of the substrate; and a transfer chamber having a robot adapted to transfer a substrate between the electrochemical deposition cell and the processing cell for removing exposed seed layer. The apparatus may further include a physical vapor deposition chamber adapted to deposit a full coverage seed layer on a substrate.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments. It is also noted that the relative dimensions of the components illustrated in the drawings may be exaggerated to show the details of particular components.

DETAILED DESCRIPTION OF THE PREFERRED EMBODIMENT

Figure 1:
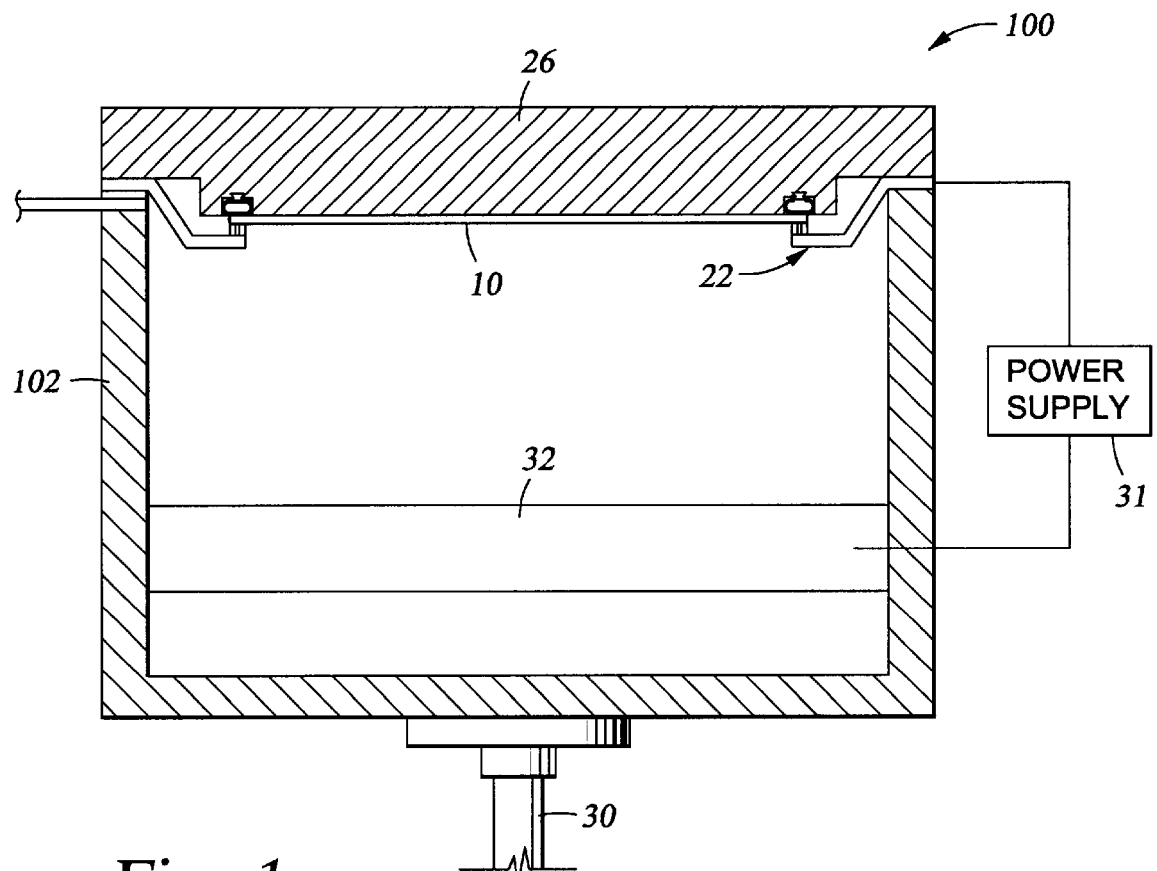
FIG. 1 is a cross sectional view of a typical fountain plater 100.
Figure 3:
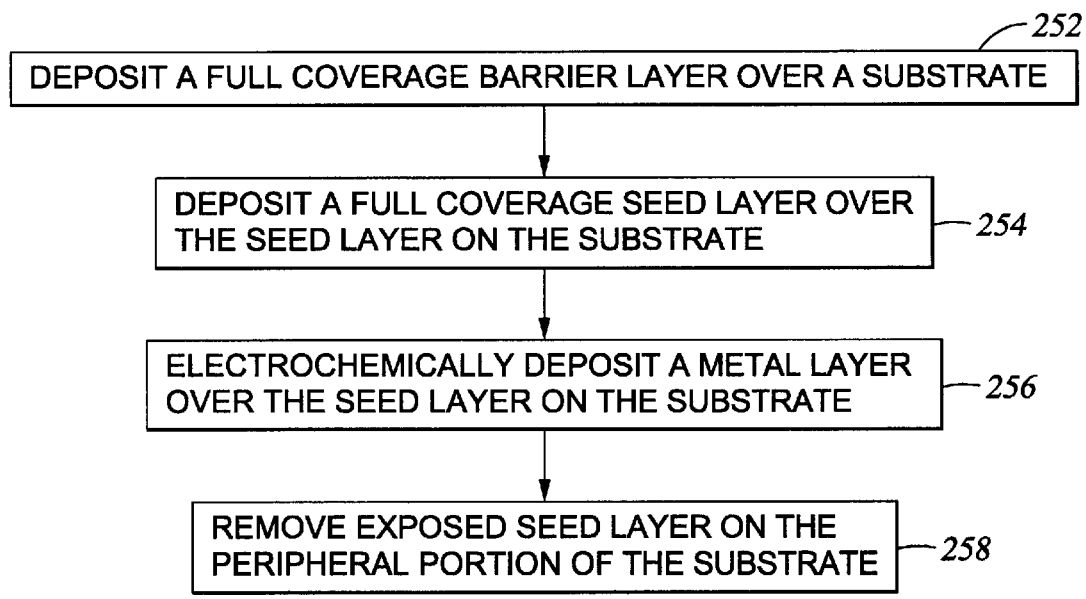
FIG. 3 is a flow diagram illustrating the method for forming a metal layer according to the invention.
Figure 2A:
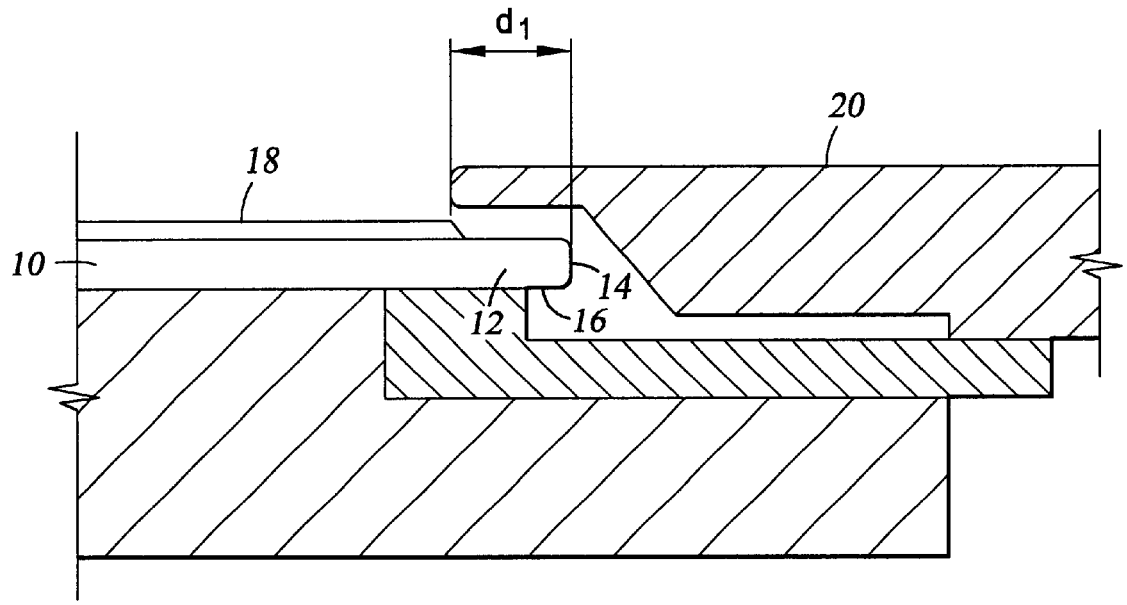
FIG. 2A is a cross sectional view of an edge portion of a substrate 10 and a shadow ring 20 disposed above the substrate in a typical PVD system utilized for depositing a seed layer
Figure 2B:
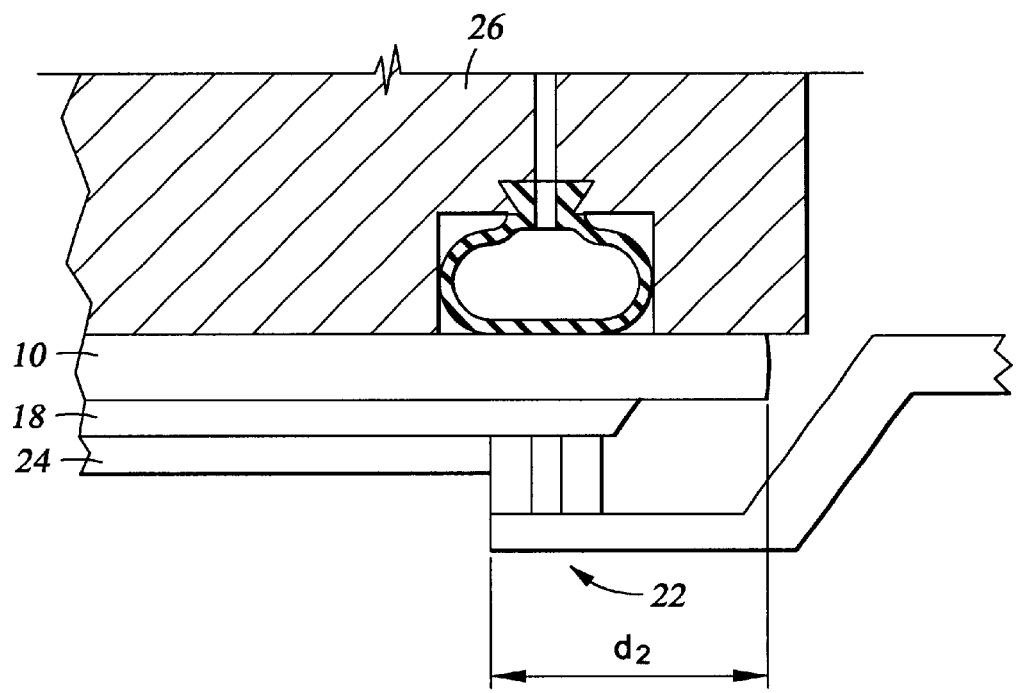
FIG. 2B is a cross sectional view of an edge portion of a substrate 10 disposed on a substrate holder 26 and a cathode contact member 22 of an electroplating system.

The present invention generally provides an apparatus and a method for forming a metal layer utilizing electrochemical deposition on a substrate having a dielectric layer formed thereon and a plurality of interconnect features, such as vias, contacts and lines, formed in the dielectric layer. The present invention achieves a number of commercial goals such as high throughput of the system and minimal edge exclusion on the substrate. FIG. 3 is a flow diagram illustrating the method for forming a metal layer according to one aspect the invention. A substrate having, for example, a dielectric layer and an unfilled/etched interconnect feature structure (e.g., vias, contacts and dual damascene structures) formed in the dielectric layer is introduced into a physical vapor deposition chamber adapted to deposit a full coverage seed layer on the substrate. A full coverage seed layer is deposited on the substrate, including the peripheral portions of the substrate and the surfaces of the interconnect features thereon (Step 254). Prior to deposition of the seed layer, a full coverage barrier layer may be deposited on the substrate to protect against diffusion of subsequently deposited seed layer material into the dielectric layer on the substrate (Step 252). After the full coverage seed layer has been formed, the substrate is then transferred into an electrochemical deposition cell adapted to provide electrochemical deposition of a metal layer having less than about 3 mm edge exclusion, and a metal layer is electrochemically deposited on the substrate to fill the interconnect features, such as vias, contacts and lines (Step 256). The substrate is then transferred to a processing cell adapted to remove the remaining exposed seed layer on the peripheral portion of the substrate, including the bevel edge and the backside surface of the substrate (Step 258). The processing cell for removing the seed layer preferably comprises a de-plating cell, or alternatively, an etching cell. Alternatively, the electrochemical deposition cell may be adapted to perform a de-plating process. After the seed layer has been removed from the peripheral portion of the substrate, the substrate is ready for other processing such as planarization and further processes to complete the formation of devices.

Full Coverage PVD Chamber

Figure 4A:
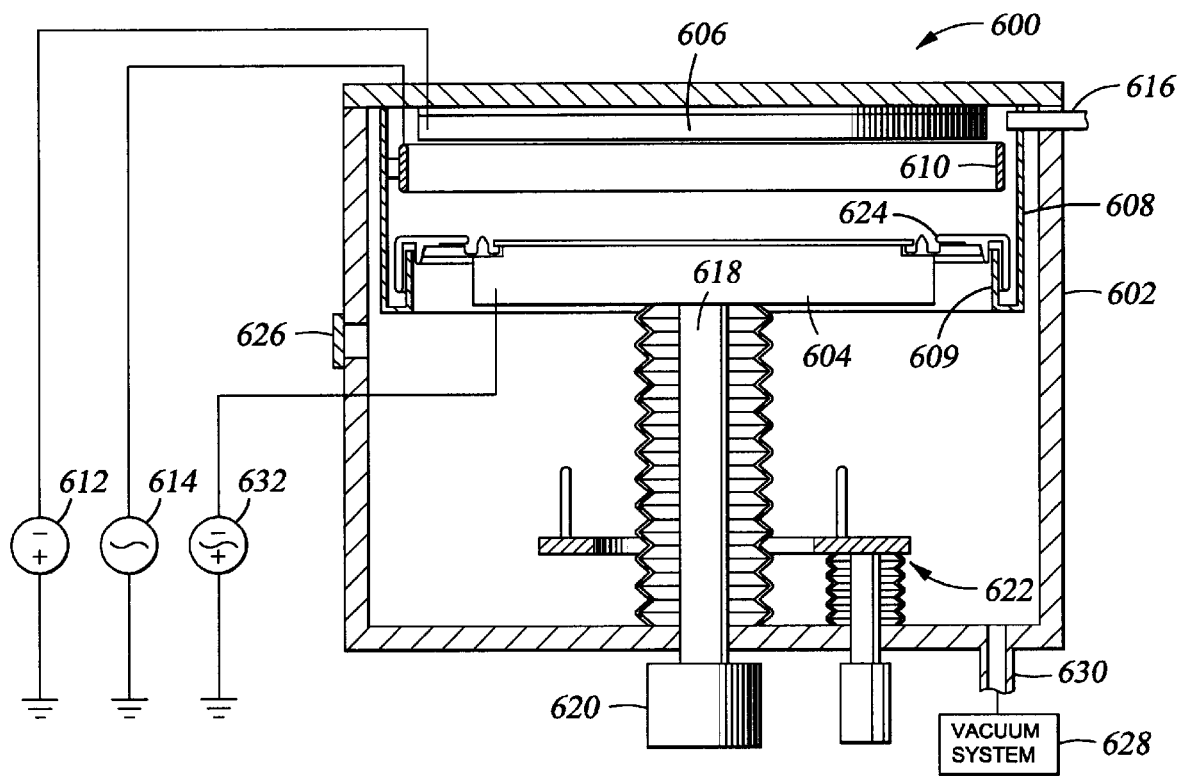
FIG. 4A is a cross sectional view of a physical vapor deposition (PVD) chamber adapted to deposit a full coverage seed layer on a substrate.
Figure 4B:
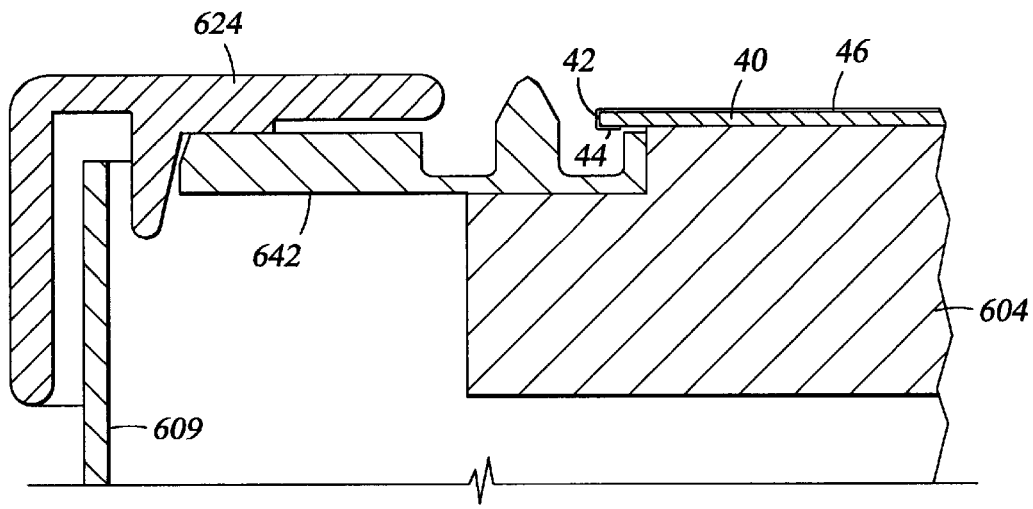
FIG. 4B is a cross sectional detail view of an edge portion of the substrate disposed in a PVD chamber configured for full coverage deposition.

FIG. 4A is a cross sectional view of a high/medium density plasma physical vapor deposition chamber useful for forming full coverage layers according to the present invention. The PVD chamber as shown is known as an ionized metal plasma physical vapor deposition chamber or IMP-PVD chamber. FIG. 4B is a cross sectional view of an edge portion of the substrate disposed in a PVD chamber configured for full coverage deposition as in FIG. 4A. An example of a commercially available PVD chamber is the IMP® PVD chamber, available from Applied Materials, Inc., Santa Clara, Calif. Although the invention is described in reference to an IMP-PVD chamber, it is understood that the barrier layer and the seed layer can be deposited utilizing other PVD systems.

Referring to FIGS. 4A and 4B, the IMP-PVD deposition chamber 600 generally includes a chamber enclosure 602, a substrate support member 604, a target 606, a shield 608 and a coil 610. The target 606 comprises a sputterable material and is disposed opposite the s substrate support member 604. The target 606 is electrically connected to a DC power supply 612, and can be biased by an RF power source (not shown) in addition to or instead of the DC power supply 612. The shield 608 generally surrounds the region between the target 606 and the substrate support member 604 and is typically grounded. The shield 608 includes an inner upturned wall 609 that supports a shield ring 624 when the substrate support member 604 is not moved to the substrate processing position. The coil 610 is disposed interior of the shield 608 and is connected to an RF power supply 614. A gas inlet 616 disposed through the enclosure 602 introduces one or more processing gases into the chamber during processing. A vacuum system 628 is connected to the chamber 600 through an exhaust port 630 to exhaust gases in the chamber and maintain a desired pressure in the chamber. Preferably, the vacuum system 628 comprises one or more vacuum pumps, turbo-molecular pumps, roughing pumps or cryopumps. Preferably, a power supply 632 is electrically connected to the substrate support member 604 to provide an electrical bias to the substrate during processing. The power supply 632 can be a DC power source, an RF power source, or a combination of DC and RF power sources.

The substrate support member 604, preferably comprising an electrostatic chuck or a vacuum chuck, is attached to a movable shaft 618 disposed through the bottom of the enclosure 602. The movable shaft 618 is connected to an actuator 620 which facilitates movement of the substrate support member 604 to various positions in the chamber, including a substrate processing position and a substrate transfer position. A slit valve 626 disposed on a sidewall of the enclosure 602 facilitates transfer of substrates into and out of the chamber, which is typically performed utilizing a robot and robot blade (not shown). A substrate lift assembly 622 facilitates positioning of a substrate onto and off of the substrate support member 604 to cooperate with the robot blade during substrate transfer. During substrate transfer, the substrate support member 604 is lowered by the actuator 620 to a substrate transfer position at about the level of the slit valve 626. To transfer a substrate out of the chamber, the substrate lift assembly 622 lifts the substrate above the substrate support member 604, and a robot blade is extended through an opened slit valve 626 to a position below the substrate. The substrate lift assembly 622 then lowers the substrate onto the robot blade, and the robot blade retracts out of the chamber with the substrate thereon. To transfer a substrate into the chamber, the robot blade extends into the chamber and positions a substrate above the substrate support member 604, and the substrate lift assembly 622 lifts the substrate off the robot blade so that the blade can be retracted. After the robot blade retracts out of the chamber, the substrate lift assembly 622 lowers the substrate onto the substrate support member 604.

As shown in FIGS. 4A and 4B, the substrate support member 604 is raised to position the substrate thereon in a substrate processing position. At this position, a processing region is defined by the exposed surfaces of the target 606, the shield 608 and the substrate 40 on the substrate support member 604. The substrate support member 604 includes a deposition ring 642 disposed on a peripheral edge of the substrate support member 604. During processing, the actuator 620 elevates the substrate support member 604 to a substrate processing position, where the deposition ring 642 engages the bottom of the shield ring 624 and lifts the shield ring 624 off of the inner upturned wall of the shield 608. The inner portion of the shield ring 624 extends over an outer portion of the deposition ring 642. The shield ring 624 does not extend over the peripheral edge 42 of the substrate and allows full coverage deposition on the substrate 40. Thus, the substrate receives full deposition coverage over the whole substrate deposition surface and the substrate edge 42. In the configuration shown in FIGS. 4A and 4B, the substrate also receives partial deposition on the peripheral portion of the backside surface 44 that extends outwardly from the substrate support. The full coverage deposition process provides a conformal seed layer 46 which extends over substantially all of the surface of the substrate on which the contacts in the cathode contact member of an electroplating system can be connected. By moving the contacts outwardly to the edge of the substrate, less than 3 mm edge exclusion can be achieved as discussed below.

Typically, the substrate comprises a semiconductor wafer having a dielectric layer formed thereon, and a plurality of interconnect features, such as lines, vias, contacts, can be formed in the dielectric layer by etch processes. Deposition of dielectric layers and etching of interconnect features in the dielectric layers are generally known in the art and can be performed utilizing a variety of processes. Preferably, prior to deposition of the seed layer, a full coverage barrier layer is deposited over the substrate to protect against diffusion of subsequently deposited material into the dielectric layer on the substrate, or where the features contacts silicon, to prevent inter-diffusion of the silicon and conductor. For copper seed layers and copper metallization, the barrier layer material preferably comprises one or more materials selected from tantalum (Ta), tantalum nitride ($TaN_x$), tungsten (W), tungsten nitride ($WN_x$), titanium (Ti), titanium nitride ($TiN_x$) and combinations thereof. Preferably, the barrier layer and the seed layer are deposited utilizing full coverage PVD chambers as described herein.

Several parameters of the IMP-PVD process can be adjusted to achieve a desired barrier layer and seed layer deposition profile having acceptable sidewall and bottom coverage in high aspect ratio interconnect features. The IMP-PVD processing parameters, such as the processing pressure, the RF bias to the coil, the DC or RF bias to the target, and the DC or RF bias to the substrate, are adjusted to re-sputter deposition from the sidewall portions of the features to the base portions of the features. Particularly, the substrate bias during deposition is increased to effectuate an increased re-sputtering rate from deposited materials on the sidewall portions of the features and an increased deposition rate on the bottom of the feature. Typically, the IMP-PVD processing parameters are adjusted to achieve a ratio of sidewall re-sputtering rate to deposition rate of up to about 2:3. Preferably, the resulting deposition profile on the surfaces of the feature has a ratio of sidewall deposition thickness to base deposition thickness of between about 1:1 and 1:3. The chamber processing pressure is preferably maintained at between about 10 mTorr and about 100 mTorr, the RF source power to the IMP-PVD coil at between about 1000W and about 5000W, the target DC bias at between about 500W and about 3000W and substrate DC bias at between about 100W and about 500W.

The seed layer preferably has a thickness between about 1500Å A and about 2500Å over the field of the substrate, between about 150Å and about 300Å over the base surface of the feature and less than about 100 Å, even more preferably, less than about 50 sA, deposited on the sidewall portions of the feature. After the full coverage seed layer has been deposited over the substrate, the substrate is transferred into an electrochemical deposition cell to form a metal layer and fill interconnect features.

Electroplating Cell And Cathode Contact Member

Figure 5A:
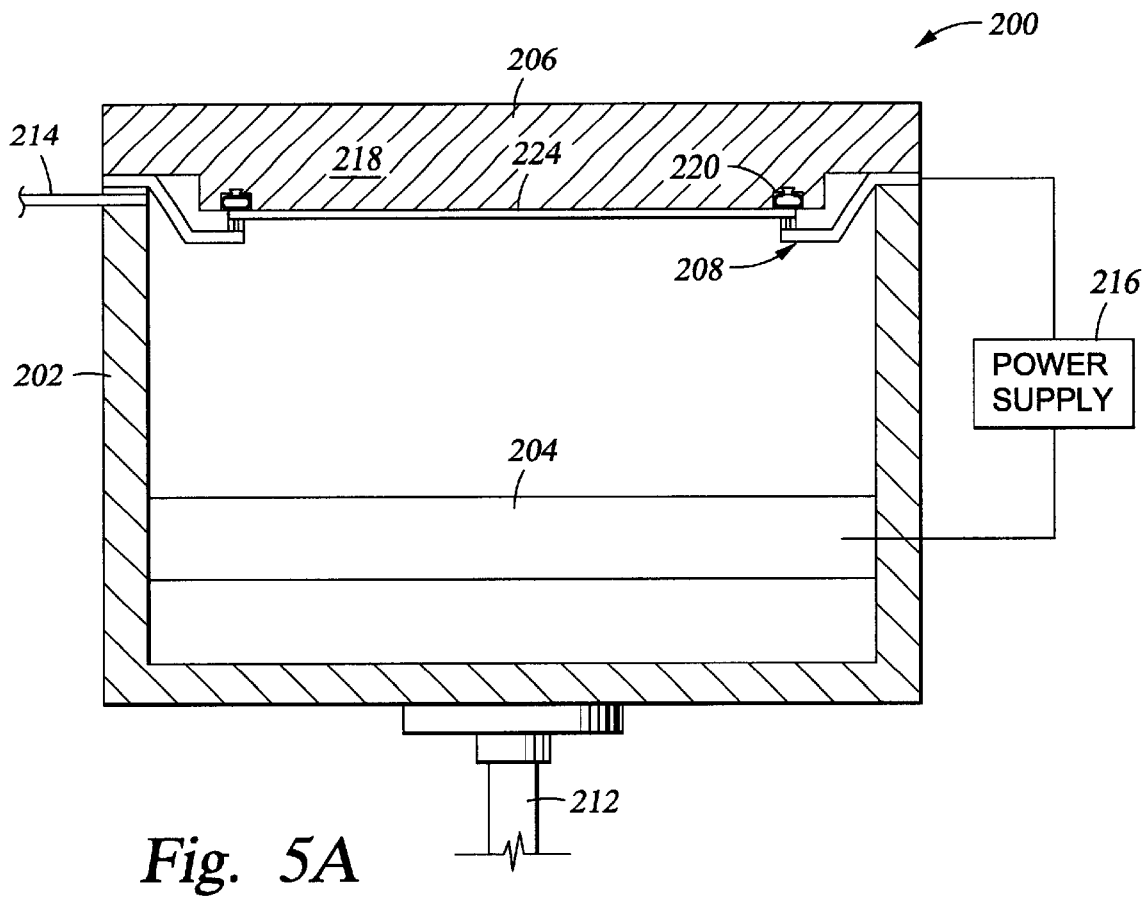
FIG. 5A is a cross sectional view of an electrochemical deposition cell adapted to achieve less than 3 mm edge exclusion according to the invention.
Figure 5B:
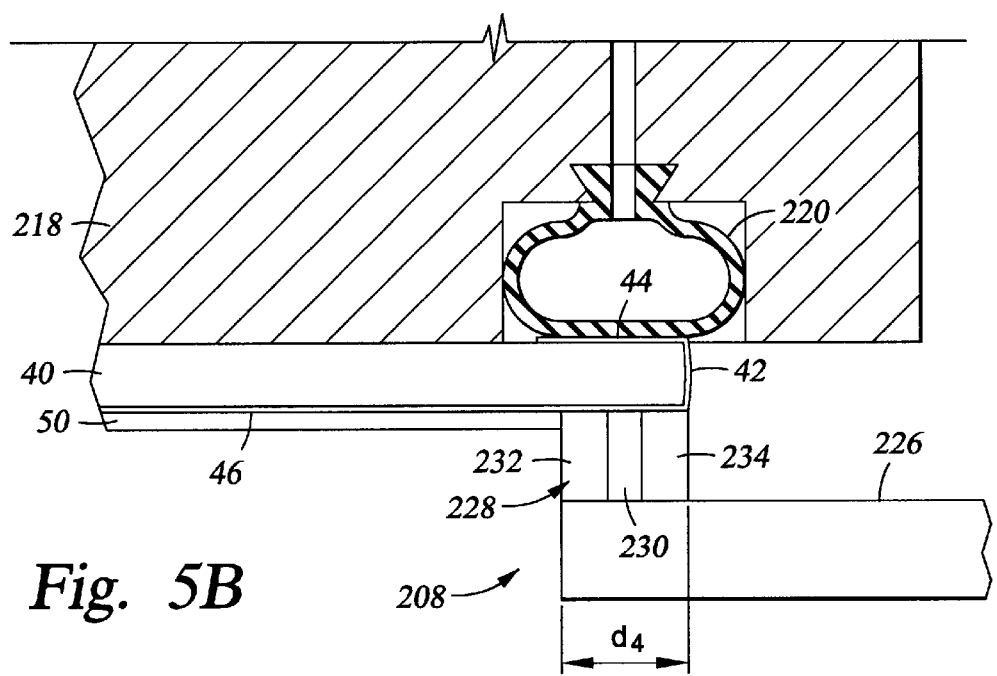
FIG. 5B is a cross sectional detail view of an edge portion of the substrate disposed on a substrate holder and a cathode contact member according to the invention.

FIG. 5A is a cross sectional view of an electrochemical deposition cell adapted to achieve less than 3 mm edge exclusion according to the invention. FIG. 5B is a cross sectional detail view of an edge portion of the substrate disposed on a substrate holder and a cathode contact member according to the invention. Although the invention is described utilizing one design of an electrochemical deposition cell, the inventors contemplate utilizing other electrochemical deposition cell designs adapted according to the invention to achieve an edge exclusion of less than about 3 mm. Examples of electrochemical deposition cells include the Electra™ECP System, available from Applied Material, Inc., Santa Clara, Calif., and the electrochemical deposition system described in commonly assigned and copending U.S. patent application Ser. No. 09/289,074, entitled "Electrochemical Deposition System," filed on Apr. 8, 1999, which is hereby incorporated by reference in its entirety. After the full coverage seed layer has been deposited over the s surfaces of the substrate, including the surfaces of the interconnect features, the substrate is transferred into the electrochemical deposition cell for electroplating a metal layer, such as copper, to fill or metallize the interconnect features.

Referring to FIGS. 5A and 5B, the electrochemical deposition cell 200 generally comprises an electrolyte container 202, an anode 204, a substrate holder 206, and a cathode contact member 208. The electrolyte container 202 has a top opening adapted to receive a substrate disposed on the substrate holder and the cathode contact member. The electrolyte container 202 is connected to an electrolyte inlet 212 and an electrolyte outlet 214. The anode 204 is disposed in the electrolyte container 202 and electrically connected to a power supply 216. The substrate holder 206 preferably comprises a vacuum chuck 218 and an annular bladder 220 surrounding the vacuum chuck 218. The vacuum chuck 218 includes a plurality of vacuum holes or channels disposed across a substrate support surface 224 of the substrate holder 206 through which a vacuum is provided to hold the substrate. The annular bladder 220 is disposed around the substrate support surface and adapted to engage the peripheral portion of the backside surface 44 of the substrate. Preferably, the annular bladder 220 comprises an inflatable bladder that provides a seal around the substrate backside edge and exerts pressure on the substrate to enhance contact between the substrate and the cathode contact member. Alternative embodiments of the bladder and the cathode contact member are described in commonly assigned and copending U.S. patent application Ser. No. 09/201,796 entitled "Inflatable Compliant Bladder Assembly", filed on Nov. 30, 1998, and U.S. patent application Ser. No. 09/201,486 entitled "Cathode Contact Ring For Electrochemical Deposition", filed on Nov. 30, 1998, which are hereby incorporated by reference in their entirety.

Figure 6:
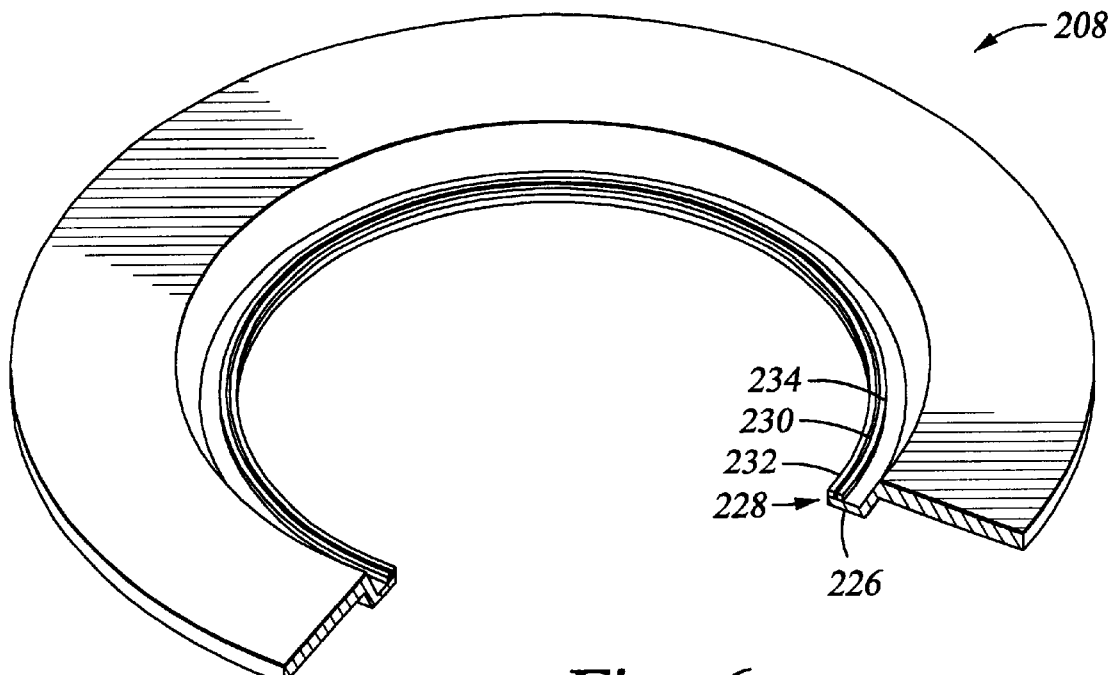
FIG. 6 is a cut-away perspective view of a cathode contact member according to the invention.

FIG. 6 is a cut-away perspective view of a cathode contact member 208 according to the invention. Referring to FIGS. 5A, 5B and 6, the cathode contact member 208 preferably comprises an annular body 226 having an inner diameter lightly smaller (i.e., less than about 3 mm) than the diameter of the substrate to be processed. A compliant electrical contact ring 228, preferably comprising a material that does not dissolve in the electrolyte, such as platinum, extends from an upper surface of the inner peripheral portion of the annular body 226. The compliant electrical contact ring 228 comprises a plurality of short wires 230 disposed between an inner compliant sealing ring 232 and an outer compliant sealing ring 234. The short wires 230 are disposed at angle to the surface to be contacted to facilitate compliant contact with the substrate. As alternatives to the compliant electrical contact ring, the cathode contact member may include other electrical contact designs, such as individual curved or semi-spherical shaped contacts.

The cathode contact member 208 is electrically connected to the power supply 216, and the compliant electrical contact ring 228 engages the peripheral portion of the substrate deposition surface to provide electrical contact between the cathode contact member 208 and the seed layer 46 on the substrate deposition surface. The compliant electrical contact ring 228 also provides a seal with the substrate to prevent the electrolyte from reaching the peripheral portion of the substrate deposition surface, the substrate bevel edge and the substrate backside surface. Preferably, the compliant electrical contact ring 228 physically contacts the seed layer 46 on the substrate deposition surface at less than about 3 mm radially inward from the edge 42 of the substrate, as indicated by $d_4$, and even more preferably, no more than about 2 mm radially inward from the edge 42 of the substrate. The size of the edge exclusion is mainly dictated by the extent of the compliant electrical contact ring extending radially inward from the edge of the substrate. For example, a compliant electrical contact ring 228 that physically contacts the substrate deposition surface at about 2 mm radially inward from the edge of the substrate achieves about a 2 mm edge exclusion from the electrochemical deposition.

During an electroplating process, the seed layer on the substrate 40 is positioned in physical contact with the cathode contact member 208, and the annular bladder 220 is engaged to provide pressure against the backside of the substrate, which forces the surface of the seed layer 46 against the compliant electrical contact ring 228 on the cathode contact member 208. The power supply 216 provides a negative voltage to the cathode contact member 208 and a forward plating current density across the seed layer 46 on the substrate plating surface to effectuate electrochemical deposition of the metal ions in the electrolyte onto the substrate plating surface. The power supply 216 also provides a positive voltage to the anode 204 to effectuate release of metal ions from the soluble anode 204. The electrical power (i.e., voltage and current) supplied to the substrate plating surface is adjusted according to the electroplating solution used and desired deposition rate and characteristics. For example, to deposit a copper layer on a 200 mm substrate using a soluble copper anode and an electroplating solution comprising copper sulfate, the cathode contact member is preferably biased to provide a forward plating current density across the substrate plating surface at between about 10 mA/cm² and about 80 mA/cm². The copper electroplating solution (i.e., electrolyte) comprises multi-components including copper electrolyte and additives such as suppressers and brighteners/accelerators. A detailed description of the electroplating chemistry, particularly the composition of the electrolyte and additives, is provided in commonly assigned and copending U.S. patent application Ser. No. 09/245,780, entitled "Electrodeposition Chemistry for Improved Filling of Apertures," filed on Feb. 5, 1999, which is hereby incorporated by reference in its entirety.

After the metal layer 50 has been formed on the substrate, the substrate is preferably transferred to a de-plating cell to remove the metal on the peripheral portion of the substrate, including the peripheral portion of the substrate deposition surface, the substrate bevel edge, and the peripheral portion of the substrate backside surface. Preferably, the de-plating cell utilizes an electrolyte or an etching solution that electively dissolves the seed layer material (e.g., copper), but does not significantly dissolve or affect the barrier material or the substrate.

De-Plating Cell And De-Plating Contact Member

Figure 7A:
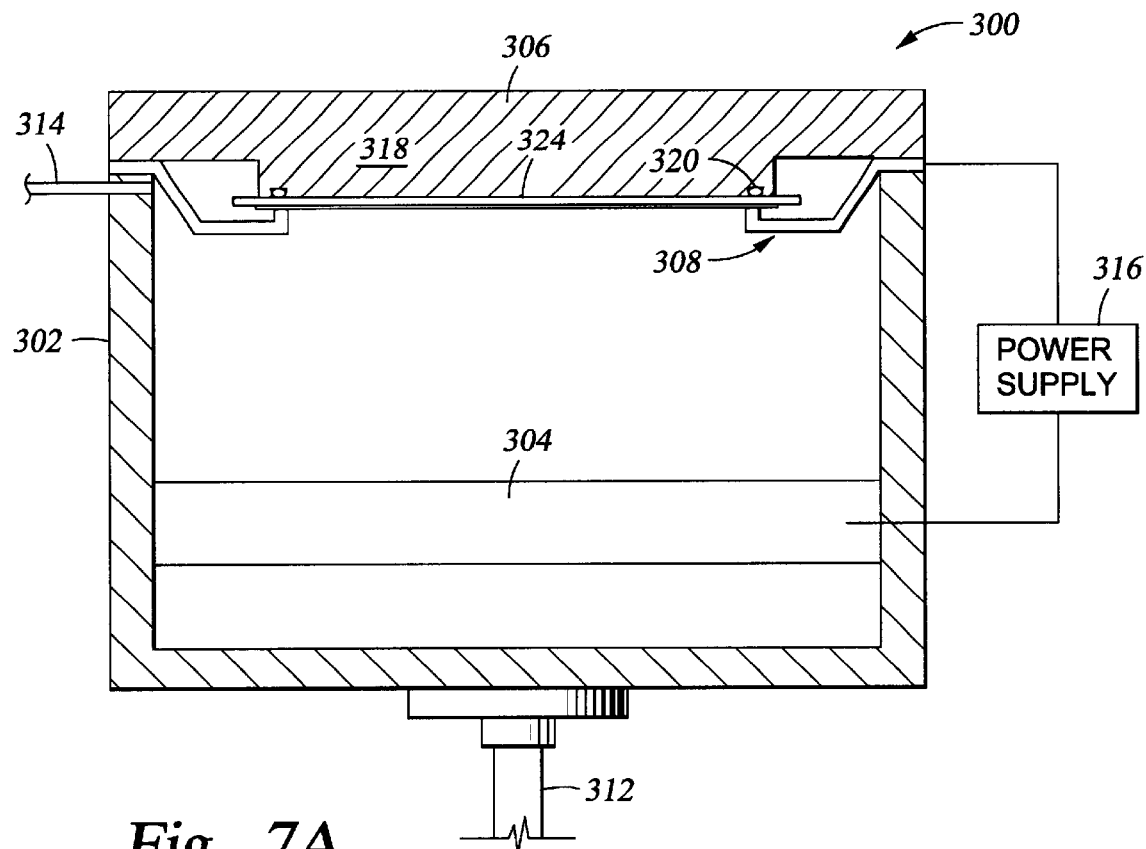
FIG. 7A is a cross sectional view of a de-plating cell having a de-plating s substrate holder and a de-plating contact member according to the invention.
Figure 7B:
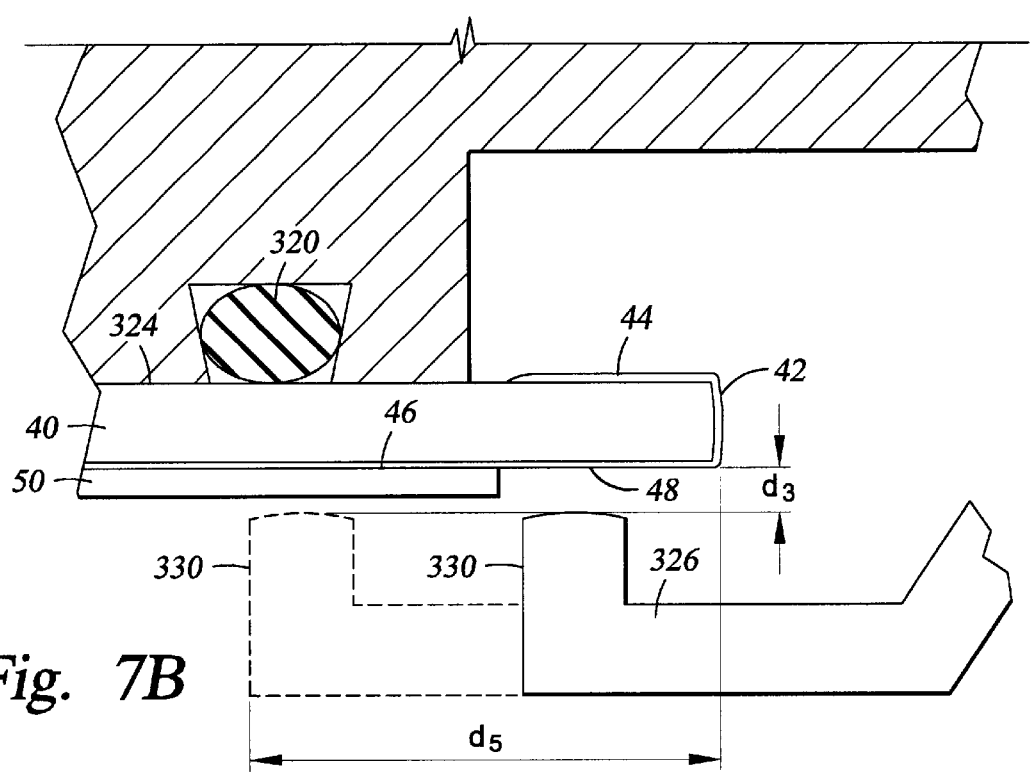
FIG. 7B is a cross sectional detail view of an edge portion of the substrate disposed on a de-plating substrate holder and a de-plating contact member according to the invention.

FIGS. 7A and 7B are cross sectional views illustrating a de-plating cell 300 having a de-plating substrate holder 306 and a de-plating contact member 308 according to one aspect of the invention. The de-plating cell 300 is separate from the plating cell to reduce contamination, and the de-plating process is performed utilizing a de-plating cathode contact member 308. Also, a separate de-plating cell facilitates removal of metal collected on the de-plating cathode contact member without introducing variations or compromising the quality of the contact surfaces of the cathode contact member that is used for the electroplating process. Alternatively, the electroplating cell, such as the cell shown in FIGS. 5A and 5B, can be adapted for use in de-plating processes as well.

The de-plating cell 300 generally comprises an electrolyte container 302, an anode 304 disposed in the electrolyte container, a de-plating substrate holder 306 and a de-plating contact member 308. The electrolyte container 302 has a top opening adapted to receive a substrate disposed on the de-plating substrate holder 306 and the de-plating contact member 308. The electrolyte container 302 is connected to an electrolyte inlet 312 and an electrolyte outlet 314. The anode 304, preferably comprising a non-consumable anode, is disposed in the electrolyte container 302 and electrically connected to a power supply 316. The electrolyte for the de-plating process comprises multi-components, including copper electrolyte and additives such as suppressers and brighteners/accelerators. The composition of the electrolyte used for the de-plating process may be the same as the electrolyte used for the plating process.

In one aspect, the de-plating substrate holder 306 comprises a vacuum chuck 318 and an annular seal 320 surrounding the vacuum chuck 318. The annular seal 320 preferably comprises a compliant 0-ring disposed in an annular groove on a substrate support surface of the de-plating substrate holder 306. The vacuum chuck 318 includes a plurality of vacuum holes or channels disposed across the substrate support surface 324 of the substrate holder 306 through which a vacuum is provided to hold the substrate. The annular seal 320 is disposed circumferentially on the substrate support surface 324 and adapted to engage an annular portion of the backside surface of the substrate. The substrate holder 306 preferably has a smaller diameter than the diameter of the substrate to expose a peripheral portion of the substrate backside surface that has the seed layer deposited thereon, and the annular seal 320 engages the substrate at a position radially inward of the peripheral portion of the substrate backside surface to expose the seed layer to the de-plating solution.

Figure 8:
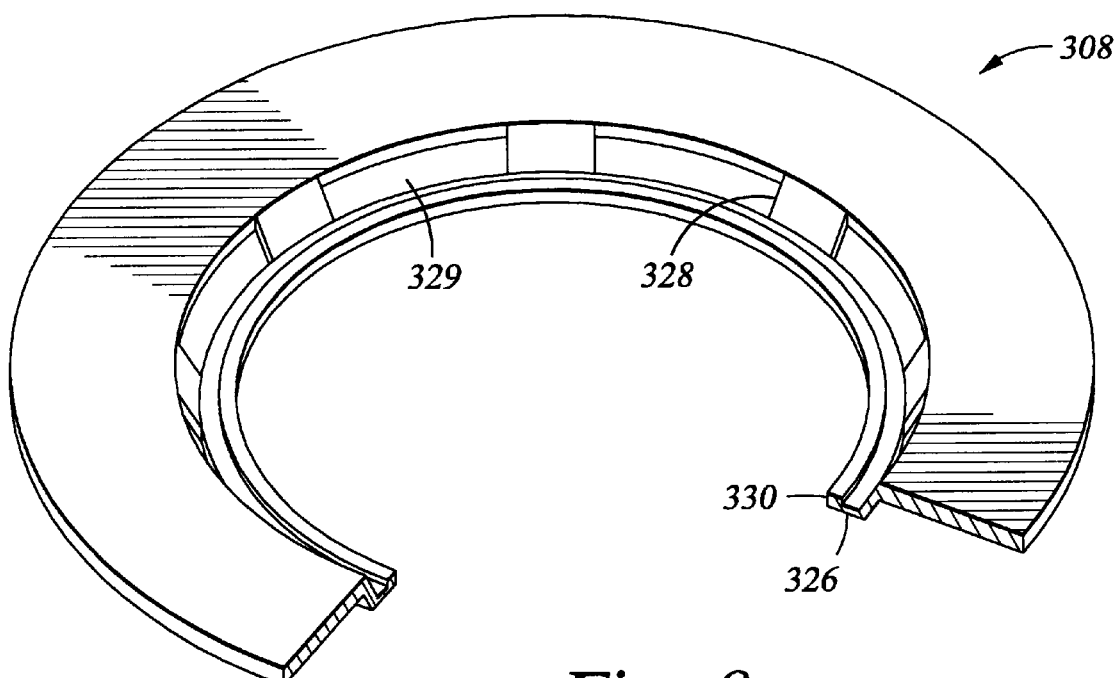
FIG. 8 is a cut-away perspective view of a de-plating contact member according to the invention.

FIG. 8 is a cut-away perspective view of a de-plating contact member 308. Referring to FIGS. 7A, 7B and 8, the de-plating contact member 308 preferably comprises an annular body 326 having a plurality of spokes or radial extensions 328 connected to a generally circular de-plating contact 330. Openings 329 between adjacent radial extensions 328 facilitate electrolyte flow to contact the peripheral portion of the substrate as well as exposed portions of the backside of the substrate. The de-plating contact member 308 comprises a metal, such as platinum or stainless steel, that resists being dissolved by the electrolyte used in the de-plating process. The de-plating contact 330 comprises an annular member disposed at a position that is radially inwardly from the edge 42 of the substrate 40 and adjacent the edge exclusion area 48 as shown in FIG. 7B. Alternatively as shown in phantom in FIG. 7B, the inner annular de-plating contact 330 is disposed at a position radially inward from the edge exclusion area 48 on the substrate. For example, for a substrate having a metal layer 50 electroplated with a 3 mm edge exclusion area, the de-plating contact 330 is preferably disposed adjacent the substrate at a distance between about 0 mm and about 6 mm, as indicated by distance $d_5$, from the edge 42 of the substrate 40. The de-plating contact 330 may also comprise a plurality of individual contacts paced substantially evenly around an annular region adjacent the edge exclusion area on the substrate, rather than the continuous annular ledge shown in FIG. 8.

The following describes a process for de-plating the metal seed layer from the edge exclusion area 48 and the seed layer on the backside 44 and the edge 42 of the substrate. The substrate 40 is introduced into a de-plating cell and positioned on the de-plating contact 330. Then, the de-plating substrate holder 306 is moved to a position to engage the backside of the substrate, and the vacuum chuck 318 is activated to securely hold the substrate on the substrate support surface 324. The de-plating substrate holder 306 moves to position the substrate surface at a distance $d_3$ which is less than 2 mm away from the surface of the de-plating contact 330. The substrate surface can even be in physical contact with the surface of the de-plating contact 330 as long as there is sufficient contact resistance between the substrate surface and the surface of the de-plating contact 330. Typically, when no force is exerted to engage the substrate surface against the de-plating contact 330, sufficient contact resistance exist between the substrate surface and the surface of the de-plating contact 330 to facilitate a de-plating process as described herein.

To begin the de-plating process, the de-plating substrate holder 306 with the substrate 40 thereon and the de-plating contact member 308 are positioned in the electrolyte container 302 in contact with the electrolyte. The inventors have discovered that when a contact resistance exists between the substrate and the contact member, deposited metal on the substrate at locations adjacent the contact surface of the contact member is de-plated onto a contact member biased with a forward plating bias. When the de-plating contact 330 is biased with a forward plating bias, the power supply biases the de-plating contact member at a negative voltage and delivers a forward plating current as if a plating process were being performed. During this de-plating process, the metal on the peripheral region of the substrate adjacent the surface of the de-plating contact 330 serves as the anode which supplies the metal ions to be plated onto the de-plating contact 330. The de-plating rate varies across the substrate surface depending mainly on the distance and the effective resistance between the de-plating contact 330 and the substrate surface. For example, for an annular de-plating contact positioned adjacent an annular region inward from the edge of the substrate, the de-plating rate decreases dramatically from the annular region adjacent the surface of the de-plating contact toward the center of the substrate. Thus, the deposited metal on the central portions of the substrate remains substantially unaffected by the de-plating process. Typically, the power supply delivers a forward plating current density between about 10 mA/cm$^2$ and about 80 mA/cm$^2$ across the surface of the de-plating contact 330 for between about 1 second and about 20 seconds during the de-plating process. Higher current densities may provide faster de-plating rates and require less time to de-plate a metal layer. The de-plating process is topped after the seed layer has been completely removed from the peripheral portions of the substrate. The substrate is removed from the electrolyte and a pin-dry process can be performed on the substrate to remove residual electrolyte from the substrate. The vacuum chuck is disengaged to release the substrate from the de-plating contact 330, and a robot transfers the substrate out of the de-plating cell.

Alternatively, the de-plating process is performed utilizing the same cell as the electroplating cell. The inventors have discovered that the metal on the substrate adjacent the cathode contact member is de-plated onto the cathode contact member when the bladder system is deflated to cause a contact resistance build up between the cathode contact surface and the metal layer. Preferably, the surface of cathode contacts are positioned at a distance less than about 2 mm from the surface of the metal layer. When the bladder system is disengaged and does not exert pressure to the backside of the substrate, the metal layer on the substrate is de-plated onto the surfaces of the cathode contact member because of the contact resistance between the adjacent surfaces, even where the cathode contacts are disposed in physical contact with the surface of the metal layer.

Wet Etch Cell

Another aspect of the invention provides a wet etch cell as an alternative to the de-plating cell for removing the metal seed layer on the peripheral portion of the substrate, including the peripheral portion of the substrate deposition surface, the substrate bevel edge, and the peripheral portion of the substrate backside surface.

Figure 9A:
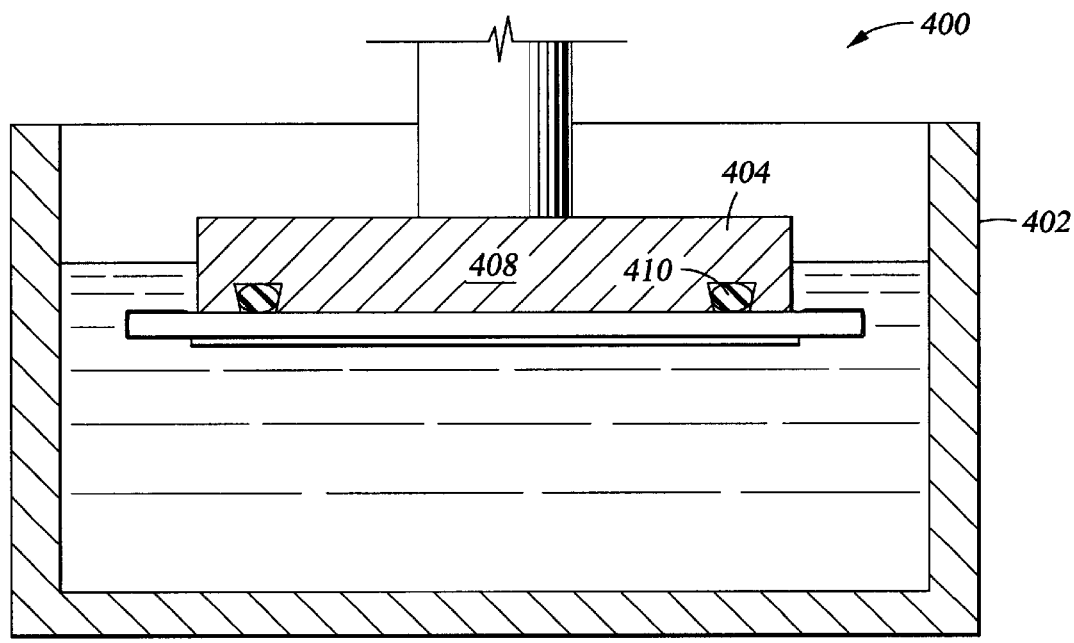
FIG. 9A is a cross sectional view of a wet etch cell according to the invention.
Figure 9B:
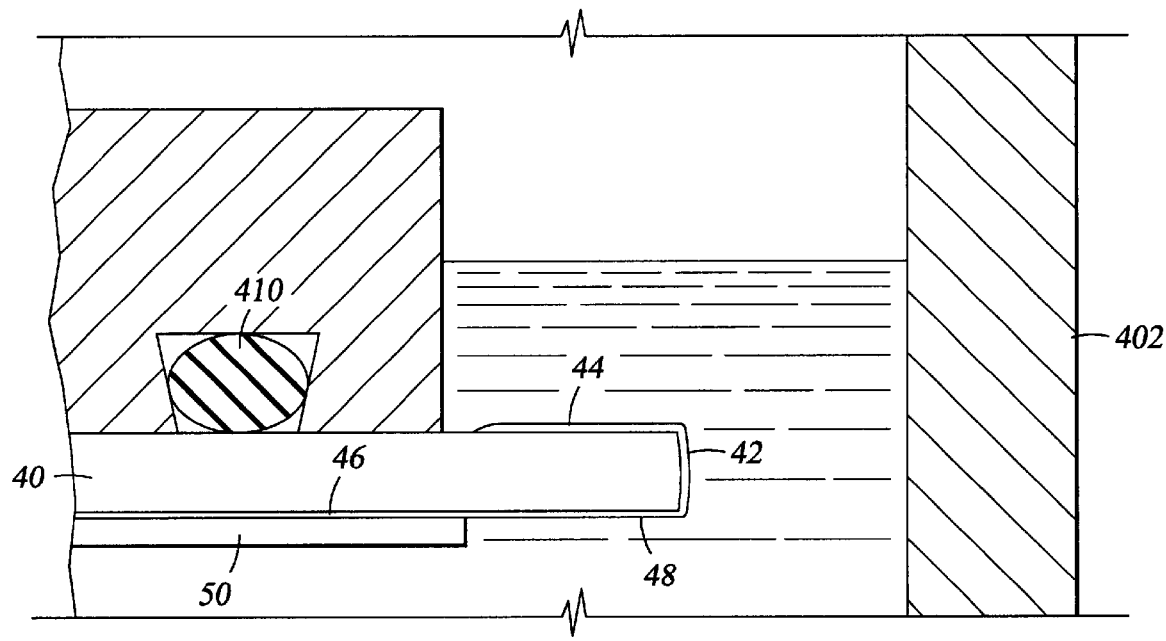
FIG. 9B is a cross sectional detail view of an edge portion of the substrate disposed in a wet etch cell according to the invention.

FIG. 9A is a cross sectional view of a wet etch cell according to another embodiment of the invention. FIG. 9B is a cross sectional view of an edge portion of the substrate disposed in a wet etch cell of FIG. 9A. The wet etch cell 400 generally comprises a container 402 and a substrate support 404. The container 402 holds the etch solution and includes a top opening adapted to receive a substrate disposed on an substrate support 404. The substrate holder 404 preferably comprises a vacuum chuck 408 and a seal 410, such as an o-ring, disposed around the vacuum chuck 408. Alternatively, the substrate holder 404 comprises a gripper, such as a vacuum gripper. The substrate support 404 is adapted to hold a substrate 40 on the backside surface of the substrate and expose the substrate deposition surface 50, the substrate edge 42, and the peripheral portion of the substrate backside surface 44 to the etch solution in the container 402.

During the wet etch process, the substrate holder 404 submerges the substrate held thereon in the etching solution in the etching solution container 402. Typically, the etching solution comprises an etchant which dissolves the exposed metal into the solution. For example, the etching solution may comprise citric acid, citric acid diluted with hydrogen peroxide (H 202 ) or other dilutants, or a combination of citric acid and sulfuric acid (H$_2$ SO$_4$) to dissolve an exposed copper layer. Preferably, the etching solution is designed to provide elective etching of the seed layer material but leaves the barrier layer on the substrate. Alternatively, the etching solution is elected to dissolve various metal compositions, including metallic barrier layers, such as tantalum nitride (TaN) and titanium nitride (TiN). The etching solution may be heated by a heater thermally attached to the etching solution container to enhance the etching process, the etching results or the etching rate. Preferably, the substrate 40 is submerged in the etching solution for a calculated period of time to remove the metal seed layer on the peripheral portion 48 of the substrate deposition surface, the substrate edge 42, and the peripheral portion of the substrate backside surface 44. The calculated period of etch time, which varies with the etching solution being used, approximately equals to the thickness of the layer to be etched (Å) divided by the etch rate (Å/s). For example, when using an etching solution comprising citric acid at a temperature between about 10° C. and about 70° C., a substrate having a copper seed layer between about 100 Å and about 2500 Å thick is submerged in the etching solution for between about 0.2 second and about 5 seconds to completely remove the copper seed layer from the peripheral portion of the substrate deposition surface, the substrate bevel edge, and the peripheral portion of the substrate backside surface.

Preferably, the electroplated metal layer 50 is masked with an etch resist to prevent removal of the electroplated metal by the etching solution. Alternatively, the electroplated metal layer is unmasked during the wet etch process, and the electrochemical deposition is extended to provide a thicker electroplated metal layer which compensates for the thickness removed during the wet etch process. The thickness of the electrochemical deposited layer on the substrate can be increased to compensate for the amount of metal that will be de-plated or etched from the surface when the substrate is de-plated or etched to remove the seed layer on the peripheral portion of the substrate. Typically, since the seed layer is less than 10 percent of the total thickness of the electroplated metal layer, a 10% increase in the thickness of the electroplated metal layer or an increase corresponding to the thickness of the seed layer is sufficient to compensate for the de-plating effects. For example, for a 1000 Å thick seed layer, the electrochemical deposition process is extended to deposit an additional 1000 Å over the desired thickness so that during the wet etch process the seed layer is completely removed and the desired thickness for the electroplated layer remains on the substrate.

Example

The above described method for forming a metal layer on a substrate can be performed in commercially available integrated process platforms, such as the Electra™ ECP Cu System and the Endura®Electra™Cu System, available from Applied Material, Inc., of Santa Clara, Calif. A substrate having a dielectric layer and interconnect features etched in the dielectric layer is introduced into a full coverage PVD chamber, and a full coverage barrier layer, comprising one or more materials elected from tantalum (Ta), tantalum nitride ($TaN_x$), tungsten (W), tungsten nitride ($WN_x$), titanium (Ti), titanium nitride ($TiN_x$) and combinations thereof, is deposited over the substrate to protect against diffusion of subsequently deposited seed layer material into the dielectric layer on the substrate. The full coverage barrier layer is deposited to a thickness between about 50 Å and 250 Å over the surfaces inside the interconnect features utilizing an IMP-PVD chamber having the barrier material (e.g., tantalum, titanium or tungsten) and the processing parameters listed in Table 1. To facilitate reactive sputtering for forming films incorporating nitrogen, nitrogen gas may be flowed into the chamber at between about 500 sccm and about 2000 sccm during the sputtering process.

TABLE 1

Chamber Processing Parameters For Deposition Of Barrier Layer and Seed Layer

| Chamber Parameter | Setting |
| --- | --- |
| Chamber Pressure | 20 mT to 100 mT |
| RF Power to Coil | 1000W to 5000W |
| Target Bias Power | 500 W to 3000W |
| Substrate DC Bias Power | 100W to 500W |
| Argon Flow | 50 sccm to 500 sccm |
| Processing Time | 30 seconds to 90 seconds |

A seed layer is deposited over the barrier layer utilizing an IMP-PVD chamber having a copper target. The seed layer is deposited to a thickness of between about 1500 Å and about 2500 Å over substantially the about oA and about 250 Å over the barrier layer surfaces inside the interconnect features utilizing the parameters listed in Table 1 utilizing an IMP-PVD chamber having a target having the seed layer material (e.g., copper).

The substrate is then transferred into an electroplating cell, and a metal layer, typically between about 1 µm and about 2 µm thick, is electrochemically deposited over the seed layer on the substrate to fill the interconnect features, such as vias, contacts and lines. The electrochemical deposition utilizing the above-described cathode contact member forms a metal layer over the substrate except for an annular portion of the substrate (i.e., less than about 3 mm edge exclusion) masked by the cathode contact member. The electrochemical deposition process is preferably performed using a soluble copper anode and an electroplating solution comprising copper sulfate, and the cathode contact member is preferably biased to provide a forward plating current density across the substrate plating surface of between about $10mA/cm^2$ and about $80mA/cm^2$.

After the electroplating process, the substrate is then transferred to a de-plating cell to remove the exposed seed layer on the peripheral portion of the substrate. The de-plating substrate holder immerses the substrate in the electrolyte, and the de-plating contact member is positioned adjacent a peripheral portion of the substrate. The de-plating process time is adjusted according to the thickness of the seed layer and the de-plating rate. Preferably, the power supply delivers a forward plating current density between about 10 mA/cm 2 and about 80 mA/cm 2 across the surface of the de-plating contact member for between about 1 second and about 20 seconds during the de-plating process to remove (i.e., de-plate) a seed layer up to about 2500 Å thick on the peripheral portion of the substrate. After the seed layer has been removed from the peripheral portion of the substrate, the substrate is typically planarized to prepare the surface for further processing and completion of the devices.

While foregoing is directed to the preferred embodiment of the present invention, other and further embodiments of the invention may be devised without departing from the basic scope thereof, and the scope thereof is determined by the claims that follow.

What is claimed is:

1. A method for forming a metal layer on a substrate, comprising:
   a) depositing a full coverage seed layer over the substrate;
   b) electrochemically depositing a metal layer over the seed layer; and
   c) removing exposed seed layer from an annular edge portion of the substrate.

2. The method of claim 1 wherein the full coverage seed layer is deposited utilizing a full coverage physical vapor deposition chamber.

3. The method of claim 1 wherein electrochemically depositing a metal layer over the seed layer comprises:
   i) electrically contacting a cathode contact member with the seed layer at a peripheral portion of the substrate that is less than about 3 mm from an edge of the substrate; and
   ii) positioning the substrate in an electroplating solution in an electroplating cell.

4. The method of claim 3 wherein electrochemically depositing a metal layer over the seed layer further comprises:
   iii) securing the substrate on a substrate holder having an inflatable bladder disposed at a peripheral portion of a back surface of the substrate; and
   iv) inflating the bladder against the peripheral portion of the back surface of the substrate.

5. The method of claim 4 wherein de-plating the exposed seed layer comprises:

i) deflating the inflatable bladder;

ii) positioning the cathode contact member between about 0 mm and about 2 mm from the substrate; and iii) applying a forward plating bias to the cathode contact member.

6. The method of claim 1 wherein removing the exposed seed layer comprises:

i) positioning the substrate in a wet etch cell; and ii) contacting the exposed seed layer with an etching solution.

7. The method of claim 1 wherein the annular edge is less than 6 mm from an outer diameter of the substrate.

8. A method for forming a metal layer on a substrate, comprising:

a) depositing a full coverage seed layer over the substrate utilizing a full coverage physical vapor deposition chamber;

b) electrochemically depositing a metal layer over the seed layer, comprising:

i) electrically contacting a cathode contact member with the seed layer at a peripheral portion of the substrate that is less than about 3 mm from an edge of the substrate; and ii) positioning the substrate in an electroplating solution in an electroplating cell; and c) removing exposed seed layer from an annular edge portion of the substrate, comprising:

i) positioning the substrate in a de-plating cell;

ii) positioning a de-plating cathode contact member adjacent the substrate; and iii) applying a forward plating bias to the cathode contact member.

9. The method of claim 8 wherein the de-plating cathode contact member comprises an annular contact surface positioned adjacent an annular peripheral portion of the substrate.

10. The method of claim 9 wherein the de-plating cathode contact member is positioned at less than about 6 mm radially inward from an edge of the substrate.

11. The method of claim 10 wherein the de-plating cathode contact member is positioned at less than about 2 mm from the exposed seed layer on the substrate.

12. The method of claim 8 wherein the annular edge is less than 6 mm from an outer diameter of the substrate.

13. A method for forming a metal layer on a substrate, comprising:

a) depositing a full coverage seed layer over the substrate;

b) electrochemically depositing a metal layer over the seed layer; and c) removing exposed seed layer from an annular edge portion of the substrate, comprising:

i) positioning the substrate in a de-plating cell;

ii) positioning a de-plating cathode contact member adjacent the substrate; and iii) applying a forward plating bias to the cathode contact member.

14. The method of claim 13 wherein the de-plating cathode contact member comprises an annular contact surface positioned adjacent an annular peripheral portion of the substrate.

15. The method of claim 14 wherein the de-plating cathode contact member is positioned at less than about 6 mm radially inward from an edge of the substrate.

16. The method of claim 13 wherein the annular edge is less than 6 mm from an outer diameter of the substrate.

\* \* \* \* \*

UNITED STATES PATENT AND TRADEMARK OFFICE
CERTIFICATE OF CORRECTION

PATENT NO. : 6,423,636 B1
DATED : July 23, 2002
INVENTOR(S) : Yezdi Dordi et al.

It is certified that error appears in the above-identified patent and that said Letters Patent is hereby corrected as shown below:

Title page, Item [54] and Column 1, line 4,
Please change "METALIZATION" to -- METALLIZATION --.

Column 1,
Line 36, please delete the "s" before "substrates".

Column 4,
Line 48, please delete the "s" before "substrate".

Column 5,
Line 5, please add -- of -- after "aspect".
Line 55, please delete the "s" before "substrate".

Column 7,
Line 50, please change "50 sA" to -- 50Å --.

Column 8,
Line 6, please delete the "s" at the end of the line.
Line 46, please change "lightly" to -- slightly --.
Line 54, please add -- an -- before "angle".

Column 9,
Line 54, please change "electively" to -- selectively --.

Column 10,
Line 24, please change "0 -ring" to -- O-ring --.

UNITED STATES PATENT AND TRADEMARK OFFICE
CERTIFICATE OF CORRECTION

PATENT NO. : 6,423,636 B1
DATED : July 23, 2002
INVENTOR(S) : Yezdi Dordi et al.

It is certified that error appears in the above-identified patent and that said Letters Patent is hereby corrected as shown below:

Column 11,
Line 53, please change "topped" to -- stopped --.
Line 56, please change "pin-dry" to -- spin-dry --.

Column 12,
Line 38, please change "(H 202 )" to -- ($H_2O_2$) --.
Line 41, please change "elective" to -- selective --.
Line 43, please change "elected" to -- selected --.

Column 13,
Line 60, please add -- field of the substrate and a thickness of between -- after "substantially the".
Line 60, please change "oA" to -- 50Å --.

Signed and Sealed this

Eleventh Day of March, 2003

JAMES E. ROGAN
*Director of the United States Patent and Trademark Office*